United States Patent [19]

Ito

[11] Patent Number: 4,843,024
[45] Date of Patent: Jun. 27, 1989

[54] METHOD OF PRODUCING A SCHOTTKY GATE FIELD EFFECT TRANSISTOR

[75] Inventor: Kazuhiko Ito, Itami, Japan

[73] Assignee: Mitsubishi Denki Kabushiki Kaisha, Japan

[21] Appl. No.: 258,498

[22] Filed: Oct. 17, 1988

[30] Foreign Application Priority Data

Oct. 22, 1987 [JP] Japan .................................. 62-268439

[51] Int. Cl.⁴ ........................................... H01L 21/28
[52] U.S. Cl. ....................................... 437/41; 437/39;
437/912; 357/22; 357/15; 148/DIG. 100
[58] Field of Search ....................... 437/38, 39, 40, 41,
437/228, 912; 357/22 I, 22 J, 22 K; 148/DIG. 100

[56] References Cited

U.S. PATENT DOCUMENTS

| | | | |
|---|---|---|---|
| 4,455,738 | 6/1984 | Houston et al. | 357/15 |
| 4,532,004 | 7/1985 | Akiyama et al. | 437/228 |
| 4,569,119 | 2/1986 | Terada et al. | 357/22 |
| 4,601,095 | 7/1986 | Kikuchi et al. | 437/41 |
| 4,694,563 | 7/1987 | Kikuchi | 437/40 |
| 4,745,082 | 5/1988 | Kwok | 437/39 |

FOREIGN PATENT DOCUMENTS

| | | | |
|---|---|---|---|
| 0106458 | 4/1984 | European Pat. Off. | |
| 0123778 | 7/1983 | Japan | 437/41 |
| 60-120574 | 6/1985 | Japan . | |
| 0222176 | 10/1986 | Japan | 437/40 |
| 0150889 | 7/1987 | Japan | 437/40 |

Primary Examiner—Brian E. Hearn
Assistant Examiner—Tuan Nguyen
Attorney, Agent, or Firm—Leydig, Voit & Mayer

[57] ABSTRACT

A method of producing a Schottky gate field effect transistor includes depositing a dummy gate film on a semiconductor substrate, depositing a second thin film on the semiconductor substrate and on the first thin film pattern to the same thickness as the first thin film, applying a photoresist on the second thin film of sufficient thickness to obtain a flat surface, etching the photoresist and second film at the same etching speed to expose the dummy gate film, removing the dummy gate film, and depositing a gate metal in place of the dummy gate film.

16 Claims, 4 Drawing Sheets

METHOD OF PRODUCING A SCHOTTKY GATE FIELD EFFECT TRANSISTOR

FIELD OF THE INVENTION

The present invention relates to a method of producing a Schottky gate field effect transistor (MESFET), and more particularly to a method capable of producing a self-aligning gate electrode with high impurity concentration source and drain regions.

BACKGROUND OF THE INVENTION

A prior art method of producing a GasAs MESFET is disclosed in Japanese Laid-open Patent Publication No. 60-120574. FIGS. 2(a) to (g) show cross-sectional views of gate electrode production flow of such a method.

In FIG. 2, reference numeral 1 designates a semi-insulating GaAs substrate. An n type GaAs layer 2 is formed in and at a surface of the semi-insulating GaAs substrate 1, for example, by as ion implantation. An $SiO_2$ pattern 3 is formed at a gate electrode production region on the n type GaAs layer 2. $N^+$ regions 4 are formed in the semi-insulating GaAs substrate 1 by ion implantation. A photoresist 6 is disposed on the entire surface of the substrate bearing the $SiO_2$ pattern 3. The $SiO_2$ pattern 3 is removed to expose region 2 and separate the photoresist into two regions. A metal 8 and 8a is disposed on and between the photoresist regions. The metal 8 forms a Schottky junction with the n type GaAs layer 2. Reference numeral 9 designates a gate electrode that is left when the excess metal 8 is removed by a lift-off technique.

The production flow will be described.

First of all, n type GaAs layer 2 is produced in a surface region of semi-insulating GaAs substrate 1, for example, by as ion implantation, and $SiO_2$ pattern 3 is deposited at the gate electrode production region on the n type GaAs layer 2 (FIG. 2(a)). Next, $N^+$ regions 4 are produced in the semi-insulating GaAs substrate 1 by ion implantation, and are activated by annealing (FIG. 2(b)). Next, photoresist 6 is applied on the entire surface of the substrate bearing the $SiO_2$ pattern 3, to such a thickness that the surface thereof becomes flat (FIG. 2(c)). The photoresist 6 is etched, for example, by reactive ion etching, to gradually thin the photoresist 6 until the top portion of the $SiO_2$ pattern 3 is exposed (FIG. 2(d)). Thereafter, the $SiO_2$ pattern 3 is etched and removed using hydrofluoric acid or the like (FIG. 2(e)). Next, a metal which can form a Schottky junction with the n type GaAs layer 2 such as aluminum, or titanium series metal is deposited over the entire surface of the substrate (FIG. 2(f)). Then, the metal 8a lying outside the gate electrode production region is lifted off, together with the photoresist 6, by an organic solvent such as acetone, thereby producing the gate electrode 9 (FIG. 2(g)). Thus, the gate electrode 9 is produced self-aligned with the $n^+$ regions 4.

In this prior art MESFET, the photoresist 6 is used both in producing the gate electrode 9 and in making the surface thereof flat. The photoresist 6 is apt to deteriorate at the reactive etching step, thereby resulting in difficulty in its removal in the final lift-off process. Furthermore, since the shapes of internal surfaces of the photoresist 6 are uniquely determined by $SiO_2$ pattern 3, wing-like tips are likely to occur at the both side surfaces of the gate electrode 9 during its production. Furthermore, since the gate electrode 9 is rectangular, no means is available for suppressing the gate resistance such as shortening the gate length. Furthermore, since the top portion of $SiO_2$ pattern 3 is exposed by thinning the photoresist 6, that $SiO_2$ exposure is difficult to detect. This means that the margin for process error and process controllability are poor.

SUMMARY OF THE INVENTION

It is an object of the present invention to provide a method of producing a self-aligned Schottky gate field effect transistor self-alignment production with a high degree of process controllability.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, since different photoresists are used for the purposes of producing a gate electrode and making the surface thereof flat, the shapes of photoresist side surfaces are easily controlled and the photoresist can be easily removed. The top portion of first thin film pattern can be exposed by removing the whole of the photoresist for making the surface thereof flat. This means that the exposure of top portion of first thin film can be easily detected, resulting in a high degree of process controllability. Furthermore, the cross-section of gate electrode is Y-shaped because the lower portion and the upper portion thereof are determined by the shapes of apertures produced at the second thin film and at the photoresist pattern for producing a gate electrode, respectively. Therefore, gate resistance can be suppressed even when the gate length is shortened.

DETAILED DESCRIPTION OF THE PREFERRED EMBODIMENTS

Figure 1A:
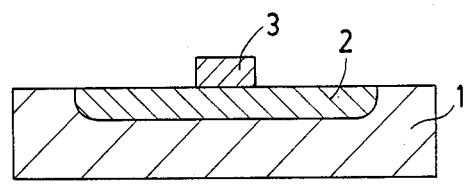
FIGS. 1(a) to 1(i) are cross-sectional views showing a production method for a MESFET according to an embodiment of the present invention.
Figure 1B:
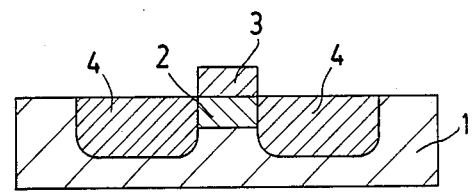
Figure 1C:
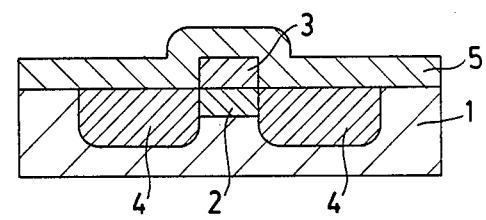
Figure 1D:
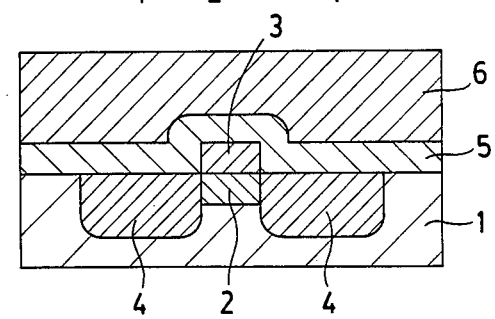
Figure 1E:
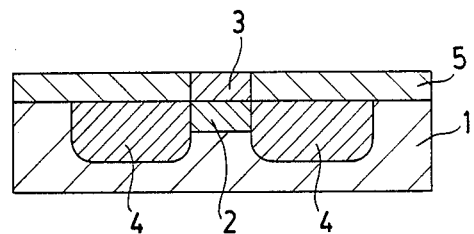
Figure 1F:
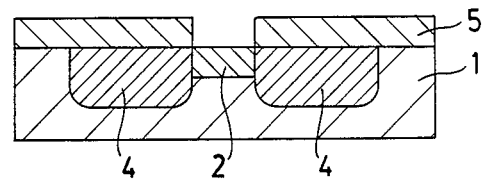
Figure 1G:
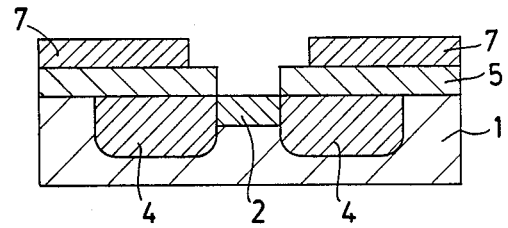
Figure 1H:
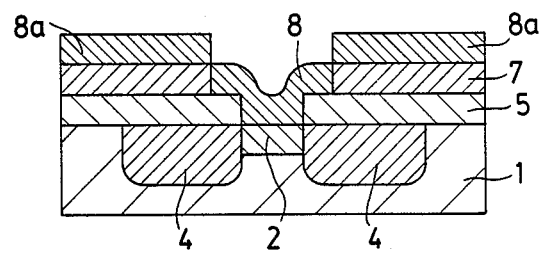
Figure 1I:
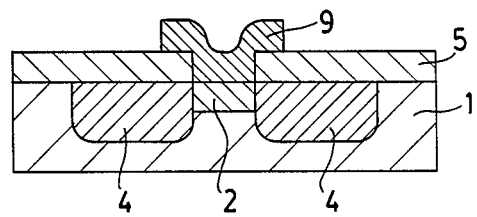
Figure 2E:
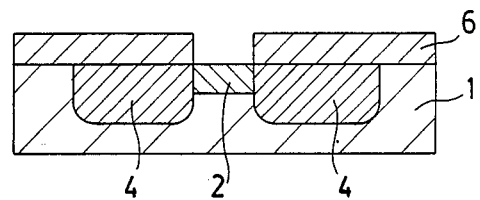
FIGS. 2(a) to 2(g) are cross-sectional views showing a production method for a MESFET according to the prior art.
Figure 2F:
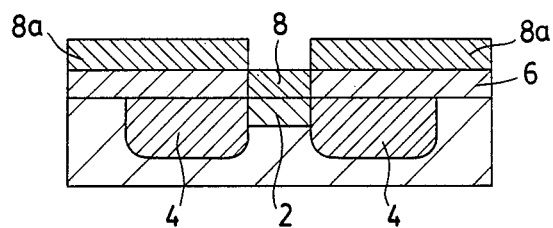
Figure 2G:
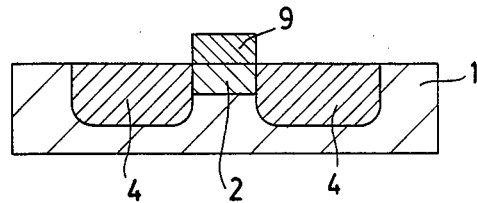
Figure 2A:
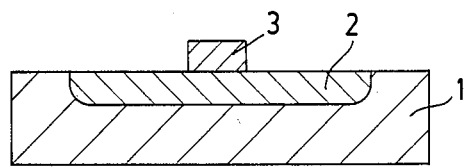
Figure 2B:
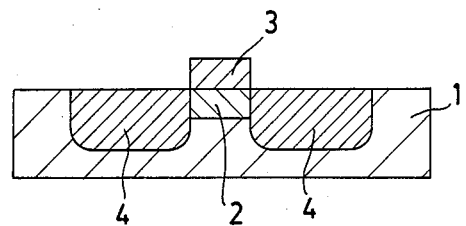
Figure 2C:
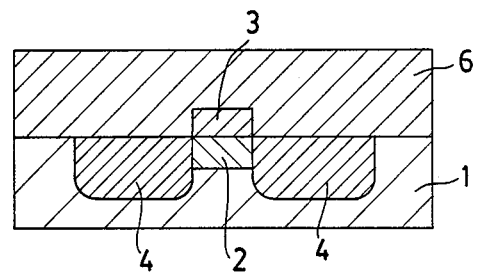
Figure 2D:
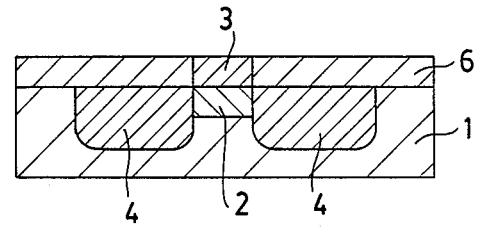

An embodiment of the present invention will be described with reference to FIG. 1.

In FIG. 1, the same reference numerals designate the same elements as those shown in FIG. 2. Reference numeral 5 designates an SiN film, reference numeral 7 designates photoresist for determining the size of upper portion of gate electrode 9, and reference numeral 8 designates a metal comprising such as aluminum, or titanium series metal, which can form a Schottky junction with n type GaAs layer 2.

The production method will be described.

First of all, n type GaAs layer 2 is formed in a region of semi-insulating GaAs substrate 1 at a surface by, for example, ion implantation, and a first thin film pattern, for example, $SiO_2$ pattern 3 is deposited at a gate electrode production region on the n type GaAs layer 2 (FIG. 1(a)). Next, $n^+$ regions 4 are formed in the semi-insulating GaAs substrate 1 by ion implantation and are activated by annealing (FIG. 1(b)). Next, a second thin film, for example, SiN film 5, is produced on the entire surface of the substrate having SiO₂ pattern 3 to the same thickness as the SiO₂ pattern 3 (FIG. 1(c)). Thereafter, photoresist 6 is applied on the entire surface of the substrate having SiN film 5 (FIG. 1(d)). Furthermore, photoresist 6 is etched and removed, for example, by reactive ion etching, under conditions such that photoresist 6 has the same etching speed as does SiN film 5 (FIG. 1(3)). Since SiN film 5 has the same thickness as SiO₂ pattern 3 and has the same etching speed as photoresist 6, when the etching end point of photoresist 6 is detected, the top portion of SiO₂ pattern 3 is reliably exposed. Thereafter, SiO₂ pattern 3 is removed by etching with hydrofluoric acid or the like (FIG. 1(f)). Next, photoresist 7 for producing a gate electrode is deposited only on SiN film 5 using conventional photolithography techniques (FIG. 1(g)). Then, a metal (gate metal) which can form a Schottky junction with n type GaAs layer 2 is deposited over the entire surface of the substrate (FIG. 1(h)). Photoresist 7 and the metal 8a thereon are removed with an organic solvent such as acetone, thereby producing a gate electrode 9 (FIG. 1(i)). Since photoresist pattern 7 is not exposed to a plasma or the like and the shapes of internal side surfaces thereof can be controlled by the photolithography processing condition, no wing-like tips produced at the side surfaces of gate electrode 9, i.e., - - - ; where gate electrode 9 contacts with the internal, vertical surfaces of photoresist pattern 7. This process enables easy production of a gate electrode. In this way, a gate electrode 9 can be produced that is self-aligning with n+ regions 4 with a high degree of control. Furthermore, since the cross-section of gate electrode 9 is of Y-shaped, gate resistance can be suppressed even when the gate length is shortened.

While in the above-illustrated embodiment SiO₂ and SiN are employed as the first and second thin films, respectively, other combinations of materials, for example, SiO₂ and SiON, SiON and SiN, and AlN and SiO₂ or SiON can also be used for the first and second thin films, respectively. Furthermore, while in the above-illustrated embodiment a GaAs series MESFET is described, it will be appreciated that the present invention may also be applied to production methods for MESFETS made of other materials, such as InP or Si.

As is evident from the foregoing description, there are provided steps of producing a first thin film pattern at a gate electrode production region on a first conductivity type semiconductor layer which is produced in a surface region of a semiconductor substrate, producing a first conductivity type high impurity concentration regions in the semiconductor substrate by impurity ion implantation, producing a second thin film on the semiconductor substrate having the first film pattern to the same thickness as the first thin film, applying a photoresist on the second thin film such that the surface thereof becomes flat, which has the same etching speed as the second thin film, etching the photoresist until the top portion of the first thin film pattern is exposed, removing the first thin film pattern by etching, producing photoresist patterns on the second thin film to have a larger aperture than that of the second film, and producing a gate electrode which has portions disposed on the second thin film by vapor deposition and lifting off the photoresist patterns. By this method, a self-aligned gate electrode can be produced with high impurity concentration regions with a high degree of control, and the gate resistance can be suppressed even when the gate length is shortened.

What is claimed is:

1. A method of producing a Schottky gate field effect transistor comprising the steps of:
   depositing a first thin film on a first conductivity type semiconductor layer which is disposed in and at a surface of a semiconductor substrate;
   producing first conductivity type high impurity concentration regions in said semiconductor substrate adjacent said first thin film by impurity ion implantation;
   depositing a second thin film on said surface of said semiconductor substrate and on said first thin film of the same thickness as said first thin film;
   applying a first mask on said second thin film in a sufficient thickness that the exposed surface thereof becomes flat;
   etching said first mask and said second film until said first thin film is exposed;
   removing said first thin film and leaving said second thin film as two regions with an aperture therebetween;
   masking part of said second thin film regions leaving an unmasked portion therebetween overlying and larger than said aperture; and
   depositing a gate electrode metal forming a Schottky barrier with said layer in said aperture and on the unmasked portions of said second thin film regions.

2. A method of producing a substrate as defined in claim 1 wherein said Schottky gate field effect transistor is GaAs.

3. A method of producing a Schottky gate field effect transistor as defined in claim 2 wherein said first thin film comprises SiO₂, and said second thin film comprises SiN.

4. A method of producing a Schottky gate field effect transistor as defined in claim 2 wherein said first thin film comprises SiO₂, and said second thin film comprises SiON.

5. A method of producing a Schottky gate field effect transistor as defined in claim 2 wherein said first thin film comprises SiON, and said second thin film comprises SiN.

6. A method of producing a Schottky gate field effect transistor as defined in claim 2 wherein said first thin film comprises AlN, and said second thin film comprises SiO₂ or SiON.

7. A method of producing a substrate as defined in claim 1 wherein said Schottky gate field effect transistor is InP.

8. A method of producing a Schottky gate field effect transistor as defined in claim 1 wherein said substrate is Si MESFET.

9. A method of producing a Schottky gate field effect transistor as defined in claim 1 including depositing a photoresist as said first mask.

10. A method of producing a Schottky gate field effect transistor as defined in claim 1 including etching said first mask and said second film by reactive ion etching.

11. A method of producing a Schottky gate field effect transistor as defined in claim 1 including adjusting the conditions of said etching step so that said first mask and said second film are etched at substantially the same rate.

12. A method of producing a Schottky gate field effect transistor as defined in claim 11 including ending said etching when said first mask is entirely removed.

13. A method of producing a Schottky gate field effect transistor as defined in claim 1 including masking by depositing a photoresist layer over said second thin film and in said aperture and removing a portion of said photoresist layer in a photolithographic process to expose said aperture.

14. A method of producing a Schottky gate field effect transistor as defined in claim 13 including masking to leave substantially equal portions of each of said second thin film regions exposed adjacent said aperture.

15. A method of producing a Schottky gate field effect transistor as defined in claim 1 including depositing said gate electrode metal by vapor deposition.

16. A method of producing a Schottky gate field effect transistor as defined in claim 1 including excess metal by dissolving the mask disposed on said second thin film regions.

* * * * *